(12) United States Patent
Tsou et al.

(10) Patent No.: US 10,474,294 B2
(45) Date of Patent: Nov. 12, 2019

(54) DISPLAY DEVICE AND COMPENSATION METHOD APPLIED TO DISPLAY DEVICE

(71) Applicant: AU OPTRONICS CORPORATION, Hsin-chu (TW)

(72) Inventors: Kun-Feng Tsou, Hsin-chu (TW); Ho-Shun Cheng, Hsin-chu (TW); Wei-Che Sun, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/794,956

(22) Filed: Oct. 26, 2017

(65) Prior Publication Data
US 2018/0292944 A1    Oct. 11, 2018

(30) Foreign Application Priority Data
Apr. 11, 2017 (TW) .............................. 106112062 A (51) Int. Cl.
*G06F 3/041* (2006.01)
*H01L 27/12* (2006.01)
*G06F 3/044* (2006.01)

(52) U.S. Cl.
CPC ............ *G06F 3/0418* (2013.01); *G06F 3/044* (2013.01); *G06F 3/0412* (2013.01); *H01L 27/124* (2013.01)

(58) Field of Classification Search
CPC .................................................... G06F 3/0418
USPC ........................................................ 345/178
See application file for complete search history.

(56) References Cited

U.S. PATENT DOCUMENTS

| | | | |
|---|---|---|---|
| 2010/0263944 A1* | 10/2010 | Lin | G06F 3/044 178/18.06 |
| 2011/0157059 A1 | 6/2011 | Chen et al. | |
| 2012/0268418 A1* | 10/2012 | Ishizaki | G06F 3/0412 345/174 |
| 2014/0107532 A1 | 4/2014 | Anderson | |
| 2014/0152613 A1* | 6/2014 | Ishizaki | G06F 3/0412 345/174 |
| 2015/0261358 A1* | 9/2015 | Liu | G06F 3/0418 345/174 |

FOREIGN PATENT DOCUMENTS

| TW | 201232350 A | 8/2012 |
|---|---|---|
| TW | I475466 B | 3/2015 |
| TW | 201545033 A | 12/2015 |

OTHER PUBLICATIONS

Office Action issued by (TIPO) Intellectual Property Office, Ministry of Economic Affairs, R. O. C. dated Oct. 23, 2017 for Application No. 106112062, Taiwan.

* cited by examiner

*Primary Examiner* — Long D Pham
(74) *Attorney, Agent, or Firm* — Tim Tingkang Xia, Esq.; Locke Lord LLP (57) ABSTRACT

A display device includes: a plurality of first signal lines, a plurality of second signal lines, and a plurality of sensing pads. The first signal lines are disposed in a first direction, and are parallel to each other. The second signal lines are disposed in a second direction, and are parallel to each other. The second signal lines are substantially perpendicular to the first signal lines. A first row and a second row of the sensing pads are disposed in zigzag in the second direction.

12 Claims, 7 Drawing Sheets

DISPLAY DEVICE AND COMPENSATION METHOD APPLIED TO DISPLAY DEVICE

CROSS-REFERENCE TO RELATED PATENT APPLICATION

This application claims priority to and the benefit of, pursuant to 35 U.S.C. § 119(a), patent application Serial No. 106112062 filed in Taiwan on Apr. 11, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to an electronic device and a method. Specifically, the present disclosure relates to a display device and a compensation method applied to a display device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the development of technologies, display devices have been widely applied in people's lives.

In some applications, a display device may have a touch-sensing function. The touch-sensing function needs to be implemented by using sensing pads. Therefore, how to properly dispose sensing pads in the display device to reduce negative impact caused by a capacity effect becomes an important subject in the art.

SUMMARY

An embodiment of the present disclosure relates to a display device. According to an embodiment of the present disclosure, the display device includes: a plurality of first signal lines, a plurality of second signal lines, and a plurality of sensing pads. The first signal lines are disposed in a first direction, and are parallel to each other. The second signal lines are disposed in a second direction, and are parallel to each other. The second signal lines are substantially perpendicular to the first signal lines. A first row and a second row of the sensing pads are disposed in zigzag in the second direction.

Another embodiment of the present disclosure relates to a compensation method applied to a display device. According to an embodiment of the present disclosure, the method includes: compensating for original readout coordinate values in correspondence to a plurality of sensing pads of the display device disposed in a first direction, to generate a compensation coordinate value. A first row and a second row of the sensing pads are disposed in zigzag in a second direction.

Through implementation of the foregoing embodiments, a difference between capacity effects corresponding to different gate lines can be reduced, so as to improve display quality.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The following clearly describes the spirit of the disclosure by using accompanying drawings and detailed descriptions. After learning the embodiments of the disclosure, a person of ordinary skill in the art can make changes and modifications to the technologies demonstrated by the disclosure without departing from the spirit and scope of the disclosure.

The terms "first", "second" and the like used herein are not necessarily for describing a sequence or an order and are not used to limit the present disclosure, but are merely used for distinguishing between elements or operations that are described by using same technical terms.

The term "electrically coupled" used herein may mean that two or more elements are in direct physical or electrical contact, or that two or more elements are not in direct physical or electrical contact, and the term "electrically coupled" may also mean that two or more elements interoperate or interact with each other.

The terms "comprise", "include", "have" and "contain" used herein are all open terms, that is, mean "including, but not limited to".

The term "and/or" used herein includes any or all combinations of the objects described.

The directional terms "on", "below", "left", "right", "front", "back" and the like used herein merely refer to directions of the accompanying drawings. Therefore, the used directional terms are intended to describe rather than limit the present disclosure.

The terms used herein generally have a normal sense of each term that is used in the field, in the disclosure and in specific content, unless specifically noted. Some terms used for describing the disclosure will be discussed below or in other parts of this specification, so as to provide additional guidance for a person skilled in the art in addition to the description of the disclosure.

Figure 1:
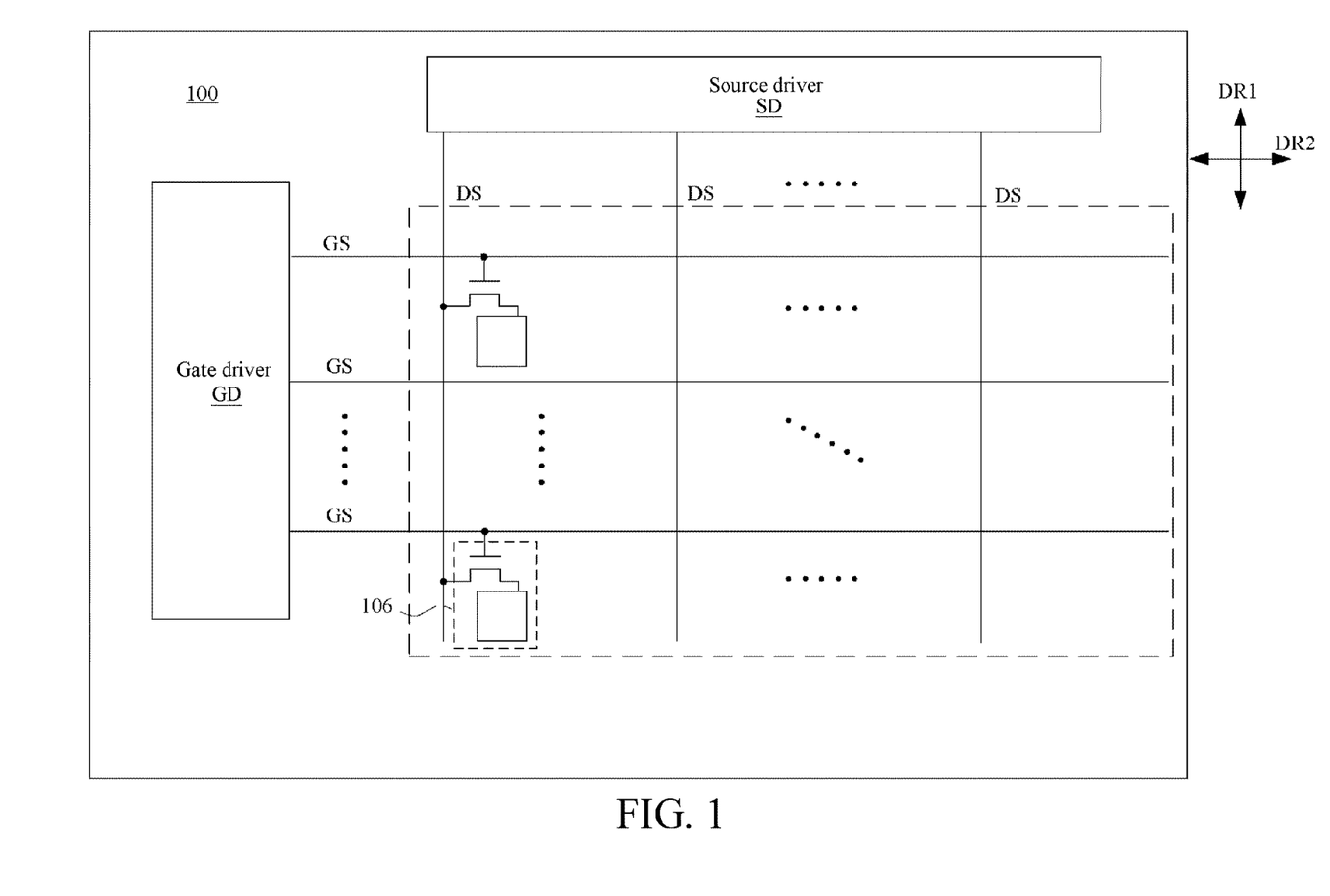
FIG. 1 is a schematic diagram of a display device according to an embodiment of the present disclosure.

FIG. 1 is a schematic diagram of a display device 100 according to an embodiment of the present disclosure. In this embodiment, the display device 100 may be a touch display device, but is not limited thereto.

In this embodiment, the display device 100 includes data lines DS, gate lines GS, a source driver SD, a gate driver GD, and a plurality of pixel circuits 106. In this embodiment, the pixel circuits 106 are disposed in a matrix form on a display area of the display device 100.

In this embodiment, the gate driver GD is electrically connected to the gate lines GS. In this embodiment, the source driver SD is electrically connected to the data lines DS.

In this embodiment, the data lines DS are disposed in a direction DR1 (extending towards the direction DR1), and the gate lines GS are disposed in a direction DR2 (extending towards the direction DR2). In this embodiment, the data lines DS are parallel to each other, and the gate lines GS are parallel to each other. In an embodiment, the data lines DS are substantially perpendicular to the gate lines GS. In an embodiment, the data lines DS are perpendicular to the gate lines GS.

In this embodiment, the gate driver GD provides scanning signals to the pixel circuits 106 row by row through the gate lines GS, to turn on switching transistors of the pixel circuits 106 row by row. The source driver SD provides, through the data lines DS, data voltages respectively to the pixel circuits 106 whose switching transistors have been turned on, so that the pixel circuits 106 whose switching transistors have been turned on perform operations in correspondence to the data voltages, for display.

Figure 2:
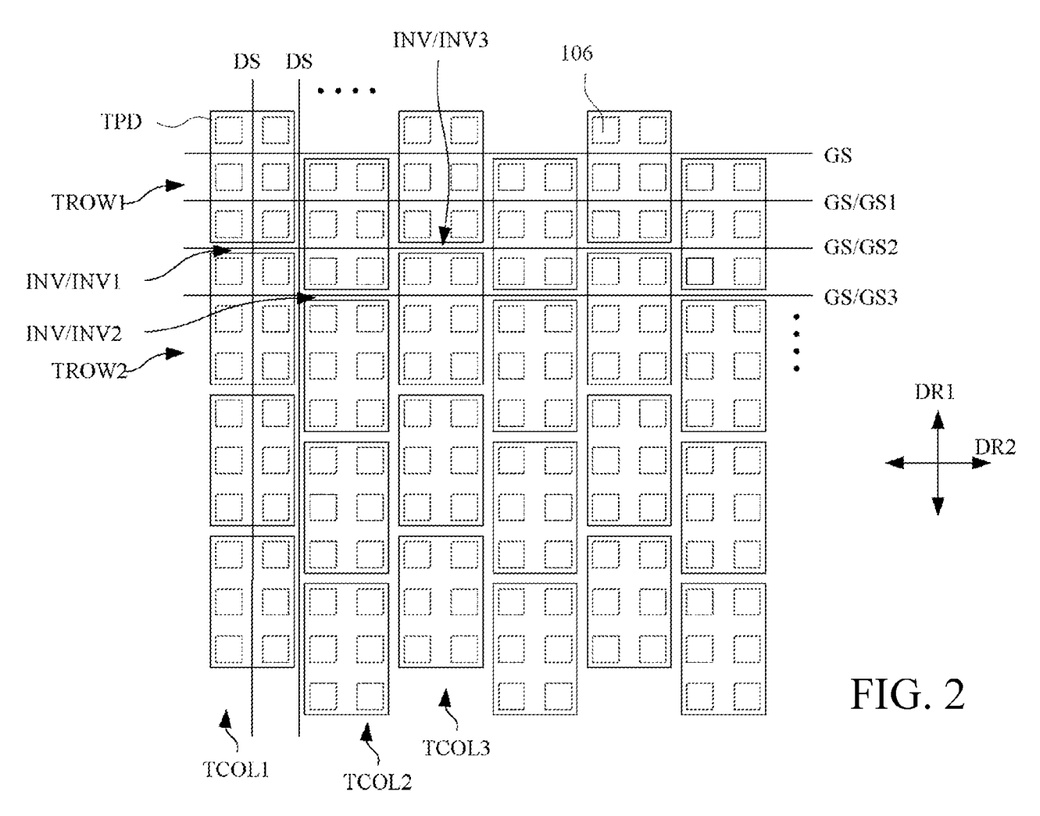
FIG. 2 is a schematic diagram of disposing of sensing pads according to an embodiment of the present disclosure.

Referring to FIG. 2, in an embodiment, the display device 100 further has a plurality of sensing pads TPD. Each sensing pad TPD corresponds to a plurality of pixel circuits 106 that is disposed in a matrix form. In an embodiment, the sensing pads TPD may be used as common electrodes for generating an electric field with pixel electrodes (not shown), to control a liquid crystal (not shown). However, the present disclosure is not limited thereto. It should be noted that in this embodiment, although an example in which each sensing pad TPD corresponds to six pixel circuits 106 is used for description, that each sensing pad TPD corresponds to another quantity of pixel circuits 106 also falls within the scope of the present disclosure.

In an embodiment, the plurality of sensing pads TPD is parallel to the data lines DS in the direction DR1. In an embodiment, a first row TROW1 and a second row TROW2 of the plurality of sensing pads TPD in the direction DR2 are disposed in zigzag in the direction DR2. In an embodiment, a first column TCOL1 and an adjacent second column TCOL2 of the plurality of sensing pads TPD in the direction DR1 are staggered, the second column TCOL2 and an adjacent third column TCOL3 of the plurality of sensing pads TPD in the direction DR1 are staggered, and the first column TCOL1 and the third column TCOL3 of the plurality of sensing pads TPD in the direction DR1 are aligned. In an embodiment, in the direction DR1, a coordinate of an interval INV1 corresponding to the first column TCOL1 of the plurality of sensing pads TPD is the same as a coordinate of an interval INV3 corresponding to the third column TCOL3; in the direction DR1, a coordinate of an interval INV2 corresponding to the second column TCOL2 of the plurality of sensing pads TPD is different from the coordinate of the interval INV1 corresponding to the first column TCOL1 and the coordinate of the interval INV3 corresponding to the third column TCOL3.

Therefore, intervals INV (for example, the intervals INV1 to INV3) formed in the direction DR2 between the first row TROW1 and the second row TROW2 of the sensing pads TPD may be in zigzag, to prevent the intervals INV from forming a single straight line.

From a different perspective, the intervals INV1 to INV3 formed in the direction DR2 between the first row TROW1 and the second row TROW2 of the plurality of sensing pads TPD have different distances from one (for example, a gate line GS1) of the gate lines GS.

In some embodiments, sensing pads are disposed in a matrix manner, and intervals formed between a first row and a second row of the sensing pads form a single straight line. In this case, a difference between a capacity effect of a gate line overlapping the single straight line formed by the intervals and a capacity effect of a gate line overlapping a sensing pad is excessively large, affecting display quality.

Comparatively, in an embodiment of the present disclosure, because the first row TROW1 and the second row TROW2 of the plurality of sensing pads TPD are disposed in zigzag in the direction DR2, the intervals INV formed in the direction DR2 between the first row TROW1 and the second row TROW2 of the plurality of sensing pads TPD can be prevented from forming a single straight line, thereby preventing from affecting the display quality due to an excessively large difference between capacity effects of different gate lines GS.

Specifically, when a voltage on a gate line GS changes because the gate line GS is used to transfer a gate signal, based on a capacity effect, the voltage change causes a drain voltage offset of a switching transistor, in a pixel circuit 106, corresponding to the gate line GS. The drain voltage offset Vth may be equal to (VGH−VGL)(Cgd/(Cst+Clc+Cgd+Cgc+Cother)). VGH is a high voltage level of the gate line GS, VGL is a low voltage level of the gate line GS, Cgd is capacitance between the gate line GS and a drain of the corresponding switching transistor, Cst is capacitance between the gate line GS and a corresponding storage capacitor, Clc is capacitance of a liquid crystal, Cgc is capacitance between the gate line GS and a corresponding sensing pad TPD, and Cother is other corresponding capacitance of the gate line GS.

In the practices of disposing the sensing pads in a matrix manner, capacitance between a gate line overlapping an interval and an adjacent sensing pad (that is, Cgc) (considered as 0 in some cases) and capacitance between a gate line overlapping a sensing pad and a corresponding sensing pad (that is, Cgc) have a significant difference. Therefore, drain voltage offsets Vth corresponding to different gate lines have a significant difference, leading to a problem of non-uniform display.

Comparatively, in this embodiment, capacitance between a gate line GS2 overlapping the interval INV1 and a corresponding sensing pad TPD (that is, capacitance Cgc between the gate line GS2 and the corresponding sensing pad TPD) is equal to capacitance between a gate line GS3 overlapping the interval INV2 and a corresponding sensing pad TPD (that is, capacitance Cgc between the gate line GS3 and the corresponding sensing pad TPD), and is approximately half of capacitance between the gate line GS1 not overlapping the interval INV3 and a corresponding sensing pad TPD (that is, capacitance Cgc between the gate line GS1 and the corresponding sensing pad TPD). In this way, a difference between drain voltage offsets Vth corresponding to different gate lines GS can be reduced, and a problem of non-uniform display can be alleviated.

Figure 3:
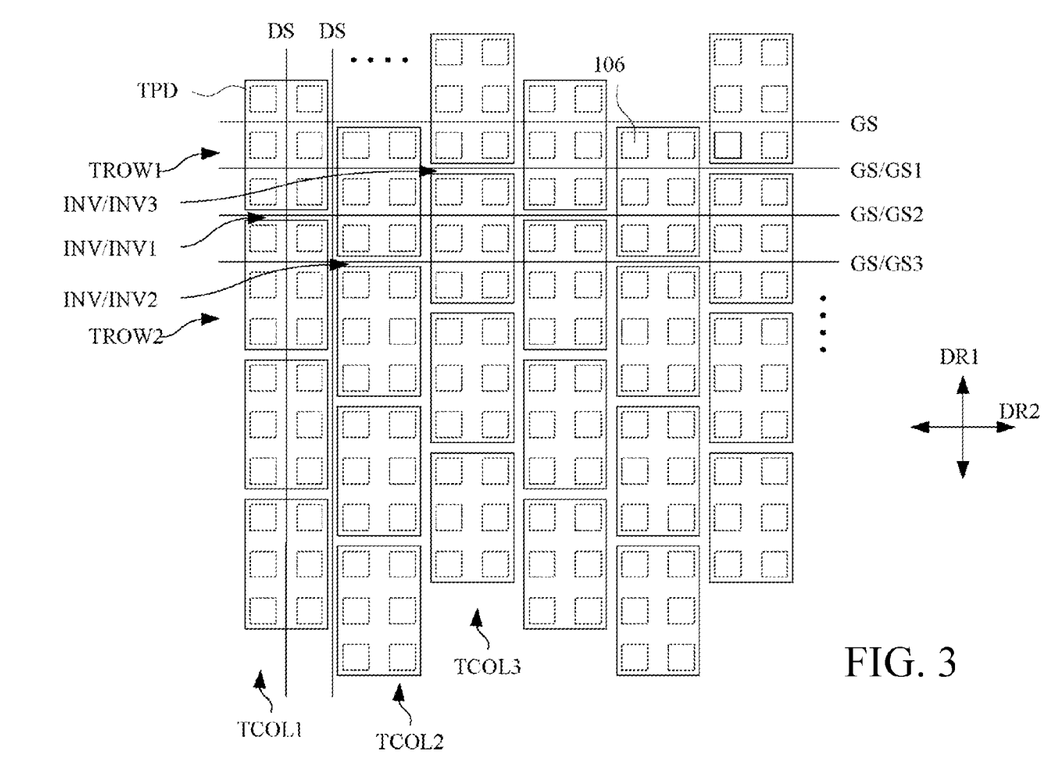
FIG. 3 is a schematic diagram of disposing of sensing pads according to another embodiment of the present disclosure.

Referring to FIG. 3, FIG. 3 shows disposing of sensing pads TPD in a different embodiment. This embodiment is basically similar to the embodiment in FIG. 2, and the following merely describes a different part.

In this embodiment, the first column TCOL1 and the adjacent second column TCOL2 of the plurality of sensing pads TPD in the direction DR1 are staggered, and the second column TCOL2 and the adjacent third column TCOL3 of the plurality of sensing pads TPD in the direction DR1 are staggered. In an embodiment, in the direction DR1, the coordinate of the interval INV1 corresponding to the first column TCOL1 of the plurality of sensing pads TPD is different from the coordinate of the interval INV2 corresponding to the second column TCOL2; in the direction DR1, the coordinate of the interval INV2 corresponding to the second column TCOL2 of the plurality of sensing pads TPD is different from the coordinate of the interval INV3 corresponding to the third column TCOL3.

Therefore, intervals INV (for example, the intervals INV1 to INV3) formed in the direction DR2 between the first row TROW1 and the second row TROW2 of the sensing pads TPD can be in zigzag, to prevent the intervals INV from forming a single straight line.

In this embodiment, the capacitance between the gate line GS2 overlapping the interval INV1 and the corresponding sensing pad TPD (that is, the capacitance Cgc between the gate line GS2 and the corresponding sensing pad TPD) is equal to both the capacitance between the gate line GS3 overlapping the interval INV2 and the corresponding sensing pad TPD (that is, the capacitance Cgc between the gate line GS3 and the corresponding sensing pad TPD) and capacitance between the gate line GS1 overlapping the interval INV3 and a corresponding sensing pad TPD (that is, capacitance Cgc between the gate line GS1 and the corresponding sensing pad TPD). In this way, a difference between drain voltage offsets Vth corresponding to different gate lines GS can be reduced, and a problem of non-uniform display can be alleviated.

Figure 4:
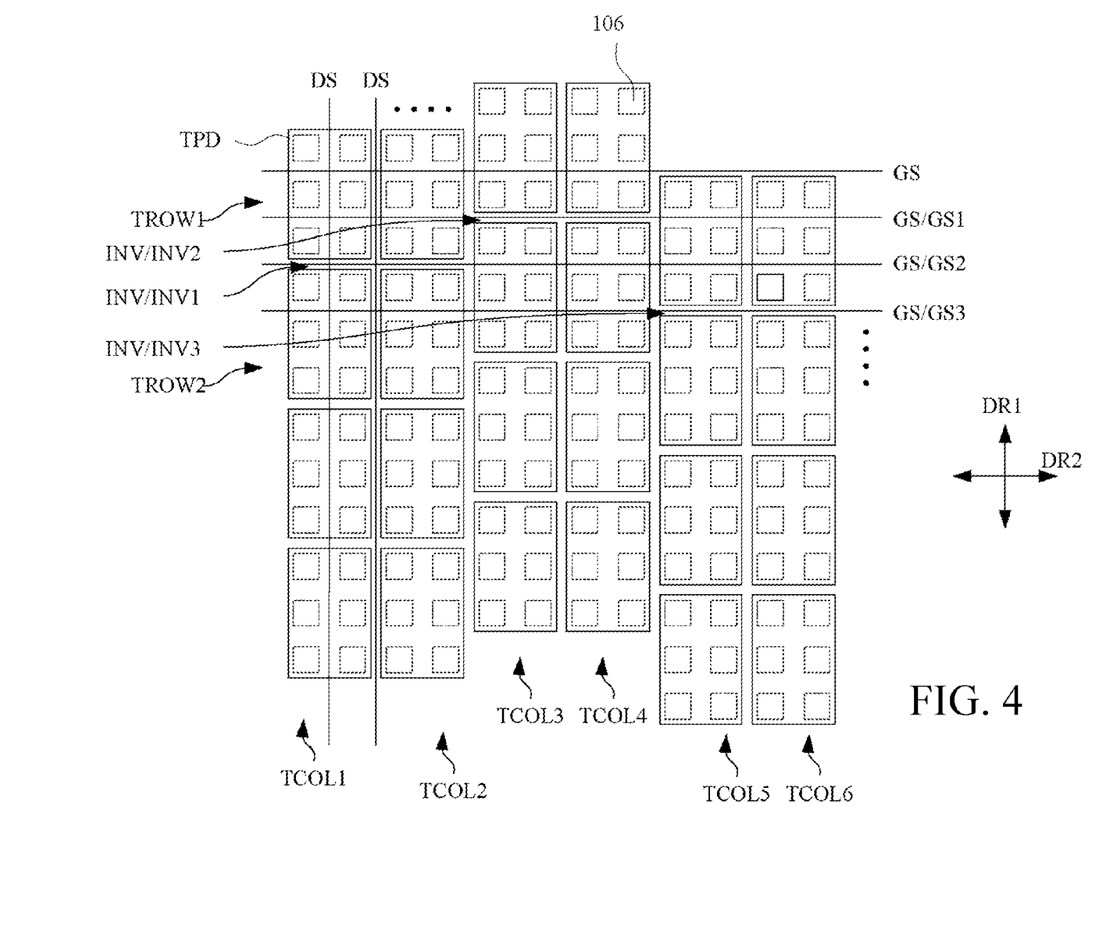
FIG. 4 is a schematic diagram of disposing of sensing pads according to another embodiment of the present disclosure.

Referring to FIG. 4, FIG. 4 shows disposing of sensing pads TPD in a different embodiment. This embodiment is basically similar to the embodiment in FIG. 3, and the following merely describes a different part.

In this embodiment, the first column TCOL1 and the adjacent second column TCOL2 of the plurality of sensing pads TPD in the direction DR1 are aligned, the second column TCOL2 and the adjacent third column TCOL3 of the plurality of sensing pads TPD in the direction DR1 are staggered, the third column TCOL3 and an adjacent fourth column TCOL4 of the plurality of sensing pads TPD in the direction DR1 are aligned, the fourth column TCOL4 and an adjacent fifth column TCOL5 of the plurality of sensing pads TPD in the direction DR1 are staggered, and the fifth column TCOL5 and an adjacent sixth column TCOL6 of the plurality of sensing pads TPD in the direction DR1 are aligned.

In an embodiment, in the direction DR1, a coordinate of a same interval INV1 corresponding to the first column TCOL1 and the second column TCOL2 of the plurality of sensing pads TPD is different from a coordinate of a same interval INV2 corresponding to the third column TCOL3 and the fourth column TCOL4 of the plurality of sensing pads TPD; in the direction DR1, the coordinate of the interval INV2 corresponding to the third column TCOL3 and the fourth column TCOL4 of the plurality of sensing pads TPD is different from a coordinate of a same interval INV3 corresponding to the fifth column TCOL5 and the sixth column TCOL6 of the plurality of sensing pads TPD.

Therefore, the intervals INV1 to INV3 formed in the direction DR2 between the first row TROW1 and the second row TROW2 of the sensing pads TPD can be in zigzag, to prevent the intervals INV from forming a single straight line.

In this embodiment, the capacitance between the gate line GS2 overlapping the interval INV1 and the corresponding sensing pad TPD (that is, the capacitance Cgc between the gate line GS2 and the corresponding sensing pad TPD) is equal to both capacitance between the gate line GS1 overlapping the interval INV2 and a corresponding sensing pad TPD (that is, capacitance Cgc between the gate line GS1 and the corresponding sensing pad TPD) and capacitance between the gate line GS3 overlapping the interval INV3 and a corresponding sensing pad TPD (that is, capacitance Cgc between the gate line GS3 and the corresponding sensing pad TPD). In this way, a difference between drain voltage offsets Vth corresponding to different gate lines GS can be reduced, and a problem of non-uniform display can be alleviated.

In addition, according to this embodiment, sensing pads TPD having a same offset in the direction DR1 may be collected for the convenience of subsequent coordinate calculation and compensation (details are described below).

Figure 5:
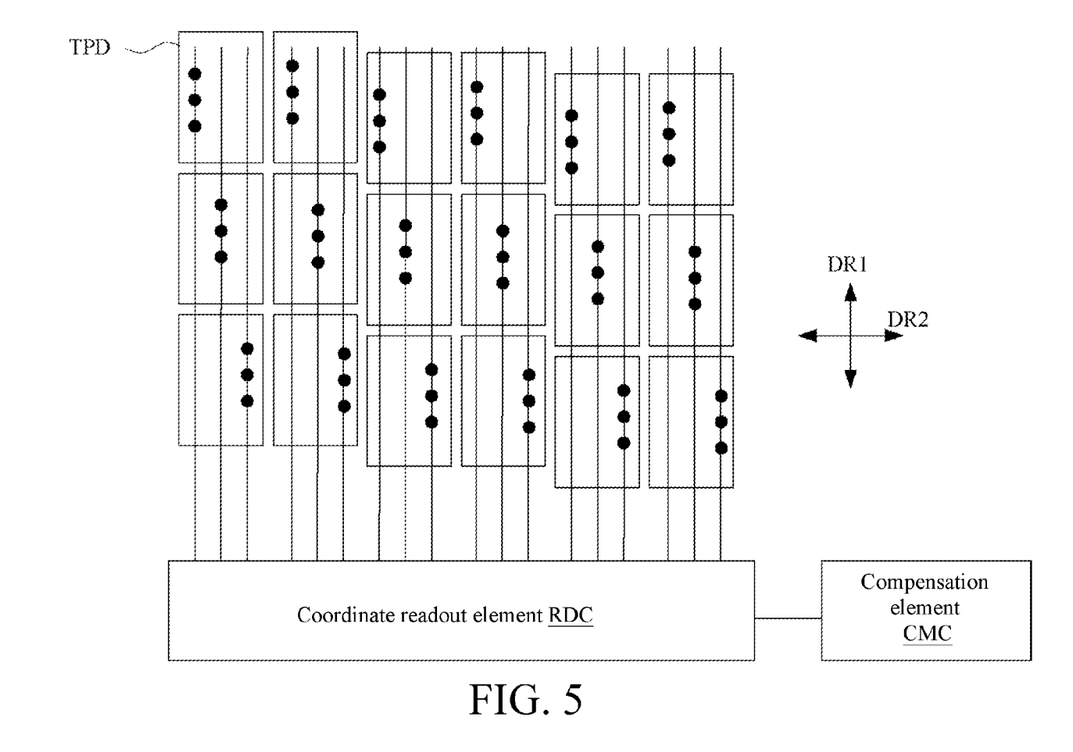
FIG. 5 is a schematic diagram of sensing pads and a compensation element according to an embodiment of the present disclosure.

Referring to FIG. 5, in an embodiment, the display device 100 further has a coordinate readout element RDC and a compensation element CMC. In an embodiment, the coordinate readout element RDC is electrically connected to the sensing pads TPD. In an embodiment, the compensation element CMC is electrically connected to the coordinate readout element RDC.

In an embodiment, the coordinate readout element RDC is configured to sense a voltage change on the sensing pads TPD, so as to read original readout coordinate values in correspondence to a touch on the sensing pads TPD. In an embodiment, the compensation element CMC is configured to receive the original readout coordinate values from the coordinate readout element RDC, and compensate for the original readout coordinate values in correspondence to the sensing pads TPD disposed in the direction DR1, to generate a compensation coordinate value.

In an embodiment, the compensation element CMC is configured to compensate for a first coordinate in the original readout coordinate values corresponding to the direction DR1, and keep a second coordinate in the original readout coordinate values corresponding to the direction DR2 unchanged. In an embodiment, the compensation element CMC is configured to obtain a compensation value from a look-up table in correspondence to a row, in which the touch is located, of the sensing pads TPD, to compensate for the original readout coordinate values.

Figure 6:
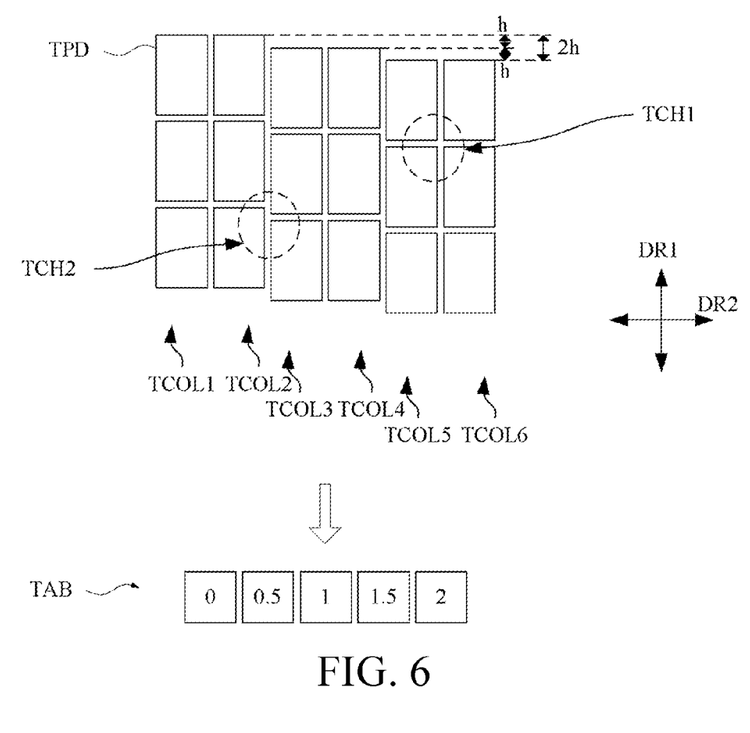
FIG. 6 is a schematic diagram of a compensation method according to an embodiment of the present disclosure.

For example, referring to FIG. 6, in this embodiment, the third column TCOL3 and the fourth column TCOL4 of the sensing pads TPD are lower than the first column TCOL1 and the second column TCOL2 of the sensing pads TPD by h in the direction DR1, the fifth column TCOL5 and the sixth column TCOL6 of the sensing pads TPD are lower than the first column TCOL1 and the second column TCOL2 of the sensing pads TPD by 2h in the direction DR1, and the fifth column TCOL5 and the sixth column TCOL6 of the sensing pads TPD are lower than the third column TCOL3 and the fourth column TCOL4 of the sensing pads TPD by h in the direction DR1. The height h, for example, may be equal to a height of one pixel (approximately a height of one pixel circuit 106), but is not limited thereto.

In this case, a compensation value, in the look-up table TAB, corresponding to the first column TCOL1 and the second column TCOL2 of the sensing pads TPD is 0; a compensation value, in the look-up table TAB, corresponding to the second column TCOL2 and the third column TCOL3 of the sensing pads TPD is 0.5; a compensation value, in the look-up table TAB, corresponding to the third column TCOL3 and the fourth column TCOL4 of the sensing pads TPD is 1; a compensation value, in the look-up table TAB, corresponding to the fourth column TCOL4 and the fifth column TCOL5 of the sensing pads TPD is 1.5; a compensation value, in the look-up table TAB, corresponding to the fifth column TCOL5 and the sixth column TCOL6 of the sensing pads TPD is 2.

In this case, the compensation element CMC can perform compensation according to a row, in which the touch is located, of the sensing pads TPD. For example, a touch TCH1 is located in the fifth column TCOL5 and the sixth column TCOL6 of the sensing pads TPD. A coordinate, corresponding to the direction DR2, in the original readout coordinate values of the touch TCH1 is, for example, 155, and a coordinate, corresponding to the direction DR1, in the original readout coordinate values of the touch TCH1 is, for example, 50. The compensation element CMC can read the compensation value (that is, 2), in the look-up table TAB, corresponding to the fifth column TCOL5 and the sixth column TCOL6 of the sensing pads TPD, and compensate for the coordinate, corresponding to the direction DR1, in the original readout coordinate values according to the compensation value, to generate a compensation coordinate (for example, 50-2p, where p is a width of a coordinate corresponding to each pixel in the direction DR1).

For another example, a touch TCH2 is located in the second column TCOL2 and the third column TCOL3 of the sensing pads TPD. A coordinate, corresponding to the direction DR2, in the original readout coordinate values of the touch TCH2 is, for example, 55, and a coordinate, corresponding to the direction DR1, in the original readout coordinate values of the touch TCH2 is, for example, 105. The compensation element CMC can read the compensation value (that is, 0.5), in the look-up table TAB, corresponding to the second column TCOL2 and the third column TCOL3 of the sensing pads TPD, and compensate for the coordinate, corresponding to the direction DR1, in the original readout coordinate values according to the compensation value, to generate a compensation coordinate (for example, 105-0.5p).

It should be noted that the values in the foregoing embodiments are merely exemplary and may change according to actual disposing, and are not limited by the foregoing embodiments.

In addition, it should be noted that an example in which the sensing pads TPD are staggered in the direction of the data lines DS (for example, the direction DR1) is used for description in the foregoing embodiments. However, actually, the sensing pads TPD may also be staggered in the direction of the gate lines GS (for example, the direction DR2) in a different embodiment, so as to reduce a difference between capacity effects of different data lines DS. In addition, in the embodiments, the compensation element CMC is configured to compensate for the coordinate, corresponding to the direction DR2, in the original readout coordinate values. For related details, refer to the foregoing paragraphs, and details are not described herein again.

Figure 7:
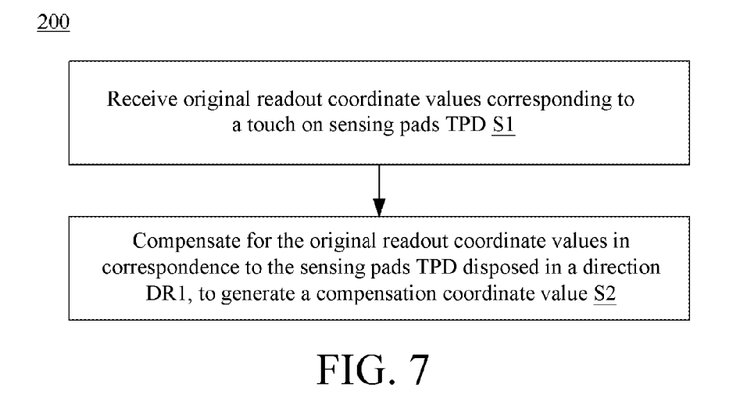
FIG. 7 is a flowchart of a compensation method of a display device according to an embodiment of the present disclosure.

FIG. 7 is a flowchart of a compensation method 200 of a display device according to an embodiment of the present disclosure.

It should be noted that the compensation method 200 may be applied to a display device having a structure the same as or similar to that shown in FIG. 1. For brevity, the following uses the display device 100 in FIG. 1 as an example to describe the compensation method 200 according to an embodiment of the present disclosure. However, the present disclosure is not limited to the application.

In addition, it should be noted that unless otherwise specified, a sequence of operations in the compensation method 200 mentioned in this implementation may be adjusted according to an actual requirement, and all or some of the operations may be performed at the same time.

Moreover, in different embodiments, these operations can be properly added, replaced, and/or omitted.

In this embodiment, the compensation method 200 includes the following operations:

Operation S1: A compensation element CMC receives original readout coordinate values corresponding to a touch on sensing pads TPD.

Operation S2: The compensation element CMC compensates for the original readout coordinate values in correspondence to the sensing pads TPD disposed in a direction DR1, to generate a compensation coordinate value.

It should be noted that, for details of the operations, refer to the foregoing paragraphs, and details are not described herein again.

According to the operations, a touch coordinate error caused by staggering of the sensing pads TPD can be compensated for.

The present disclosure is disclosed through the foregoing embodiments; however, these embodiments are not intended to limit the present disclosure. A person skilled in the art can make various changes and modifications without departing from the spirit and scope of the present disclosure. Therefore, the protection scope of the present disclosure is subject to the scope defined by the claims.

What is claimed is:
1. A display device, comprising:
a plurality of first signal lines, disposed in a first direction and parallel to each other;
a plurality of second signal lines, disposed in a second direction and parallel to each other, wherein the second signal lines are substantially perpendicular to the first signal lines;
a plurality of pixel circuits disposed in a matrix form, wherein each of the pixel circuits is connected to one of the first signal lines and one of the second signal lines; and
a plurality of sensing pads separated from each other, wherein a first row and a second row of the sensing pads are disposed in zigzag in the second direction;
wherein a plurality of intervals formed between the first row and the second row of the sensing pads in the second direction does not form a single straight line,
wherein each of the sensing pads corresponds to n rows and m columns of the pixel circuits, and n and m are integers greater than 1, and
wherein for two adjacent sensing pads in the first row of the sensing pads, at least one row of the pixel circuits corresponding to one of the two adjacent sensing pads is in a different row as the pixel circuits corresponding to the other of the two adjacent sensing pads.

2. The display device according to claim 1, wherein the sensing pads are parallel to the first signal lines in the first direction.

3. The display device according to claim 1, wherein a plurality of intervals formed between the sensing pads in the second direction is in zigzag.

4. The display device according to claim 1, wherein a plurality of intervals formed between the first row and the second row of the sensing pads in the second direction has different distances from one of the second signal lines.

5. The display device according to claim 1, wherein a plurality of adjacent first columns of the sensing pads and a plurality of adjacent second columns of the sensing pads are staggered in the first direction.

6. The display device according to claim 5, wherein the adjacent first columns of the sensing pads are aligned in the first direction.

7. The display device according to claim 1, further comprising:
   a compensation element configured to compensate for original readout coordinate values in correspondence to the sensing pads disposed in the first direction, to generate a compensation coordinate value.

8. The display device according to claim 7, wherein the compensation element is configured to compensate for a first coordinate in the original readout coordinate values corresponding to the first direction, and keep a second coordinate in the original readout coordinate values corresponding to the second direction unchanged.

9. The display device according to claim 7, wherein the compensation element is configured to obtain different compensation values in a look-up table in correspondence to different rows of the sensing pads, to compensate for the original readout coordinate values.

10. A compensation method applied to a display device, comprising:
   compensating for original readout coordinate values in correspondence to a plurality of sensing pads of the display device separated from each other and disposed in a first direction, to generate a compensation coordinate value, wherein a first row and a second row of the sensing pads are disposed in zigzag in a second direction, the display device has a plurality of pixel circuits disposed in a matrix form, each of the pixel circuits is connected to one of the first signal lines and one of the second signal lines, each of the sensing pads corresponds to n rows and m columns of the pixel circuits, and n and m are integers greater than 1;
   wherein a plurality of intervals formed between the first row and the second row of the sensing pads in the second direction does not form a single straight line;
   wherein for two adjacent sensing pads in the first row of the sensing pads, at least one row of the pixel circuits corresponding to one of the two adjacent sensing pads is in a different row as the pixel circuits corresponding to the other of the two adjacent sensing pads.

11. The compensation method according to claim 10, comprising:
   compensating for a first coordinate in the original readout coordinate values corresponding to the first direction, and keeping a second coordinate in the original readout coordinate values corresponding to the second direction unchanged.

12. The compensation method according to claim 10, comprising:
   obtaining different compensation values in a look-up table in correspondence to different rows of the sensing pads, to compensate for the original readout coordinate values.

* * * * *